US011205642B2

United States Patent
Rwei et al.

(10) Patent No.: US 11,205,642 B2
(45) Date of Patent: Dec. 21, 2021

(54) TWISTABLE LIGHT EMITTING DIODE DISPLAY MODULE

(71) Applicant: National Taipei University of Technology, Taipei (TW)

(72) Inventors: Syang-Peng Rwei, Taipei (TW); Tzu-Wei Chou, Taipei (TW)

(73) Assignee: National Taipei University of Technology, Taipei (TW)

( * ) Notice: Subject to any disclaimer, the term of this patent is extended or adjusted under 35 U.S.C. 154(b) by 47 days.

(21) Appl. No.: 16/812,393

(22) Filed: Mar. 9, 2020

(65) Prior Publication Data
US 2021/0005581 A1 Jan. 7, 2021

(30) Foreign Application Priority Data
Jul. 4, 2019 (TW) .................................. 108123545

(51) Int. Cl.
*H01L 25/075* (2006.01)
*H01L 23/498* (2006.01)

(52) U.S. Cl.
CPC ...... *H01L 25/0753* (2013.01); *H01L 23/4985* (2013.01)

(58) Field of Classification Search
CPC ................................................. H01L 23/49816
USPC ........................................................ 257/737
See application file for complete search history.

(56) References Cited

U.S. PATENT DOCUMENTS

| 7,980,863 | B1 | 7/2011 | Holec et al. |
| 2015/0377466 | A1 | 12/2015 | Gershowitz et al. |
| 2016/0105950 | A1* | 4/2016 | Drzaic ................. H05K 1/0296 174/251 |
| 2018/0149349 | A1 | 5/2018 | Shum |

FOREIGN PATENT DOCUMENTS

| JP | 2003150074 | 5/2003 |
| JP | 2008096464 | 4/2008 |
| JP | 2008166139 | 7/2008 |
| JP | 2012032471 | 2/2012 |

(Continued)

OTHER PUBLICATIONS

"Office Action of Japan Counterpart Application", dated Aug. 3, 2021, p. 1-p. 7.

(Continued)

*Primary Examiner* — Ajay Arora
(74) *Attorney, Agent, or Firm* — JCIPRNET

(57) ABSTRACT

A twistable light emitting diode display module including a twistable substrate, an electrode pattern layer, an insulating layer, a circuit layer, and a plurality of light emitting diode devices. The electrode pattern layer is disposed on the twistable substrate. The insulating layer is disposed on the electrode pattern layer, where an edge of the insulating layer has an opening, located at an edge of the twistable substrate and exposing a part of the electrode pattern layer. The circuit layer is disposed on the insulating layer and on sidewalls of the opening, and is connected to the electrode pattern layer. The plurality of light emitting diode devices are disposed on the circuit layer and are electrically connected to the circuit layer respectively, wherein each of the plurality of light emitting diode devices includes a driving circuit.

15 Claims, 4 Drawing Sheets

(56) References Cited

FOREIGN PATENT DOCUMENTS

| | | | |
|---|---|---|---|
| JP | 2012032471 A | * | 2/2012 |
| JP | 2016033635 | | 3/2016 |
| JP | 2016038579 | | 3/2016 |
| JP | 2019028423 | | 2/2019 |
| TW | I270331 | | 1/2007 |
| TW | I361027 | | 3/2012 |
| TW | I411367 | | 10/2013 |
| TW | I474763 | | 2/2015 |
| TW | I485300 | | 5/2015 |
| TW | I519225 | | 1/2016 |
| TW | I574595 | | 3/2017 |
| TW | I590806 | | 7/2017 |
| TW | I595129 | | 8/2017 |

OTHER PUBLICATIONS

Office Action of Japan Counterpart Application, dated Mar. 9, 2021, pp. 1-6.

\* cited by examiner

TWISTABLE LIGHT EMITTING DIODE DISPLAY MODULE

CROSS-REFERENCE TO RELATED APPLICATION

This application claims the priority benefit of Taiwan application serial no. 108123545, filed on Jul. 4, 2019. The entirety of the above-mentioned patent application is hereby incorporated by reference herein and made a part of this specification.

BACKGROUND OF THE INVENTION

1. Field of the Invention

The invention relates to a display module, and in particular, to a twistable light emitting diode display module.

2. Description of Related Art

As the application of display devices is gradually diversified, light emitting diode display devices for displaying messages or patterns are increasingly applied to various fields. Generally, the light emitting diode display device includes a substrate, an electrode, an insulating layer, a plurality of light emitting diode devices, and a circuit layer that electrically connects the light emitting diode display devices to each other and drives the light emitting diode devices. To electrically connect the light emitting diode devices to each other and drive the light emitting diode devices, a plurality of circuit layers need to be disposed in the light emitting diode display device, and a conductive via needs to be disposed on each circuit layer to electrically connect the circuit layers. In this way, a certain thickness of the light emitting diode display device is required. Therefore, the requirement on the small size of the light emitting diode display device at the present stage cannot be easily satisfied. In addition, based on the foregoing reasons, the product process of the light emitting diode display device is complex and cannot be easily simplified.

SUMMARY OF THE INVENTION

The invention provides a twistable light emitting diode display module, which includes a light emitting diode device including a driving circuit, and therefore, the thickness of the light emitting diode display module can be reduced.

The twistable light emitting diode display module of the invention includes a twistable substrate, an electrode pattern layer, an insulating layer, a circuit layer, and a plurality of light emitting diode devices. The electrode pattern layer is disposed on the twistable substrate. The insulating layer is disposed on the electrode pattern layer, where an edge of the insulating layer is provided with an opening, and the opening is located at an edge of the twistable substrate and exposes a part of the electrode pattern layer. The circuit layer is disposed on the insulating layer and on sidewalls of the opening, and is connected to the electrode pattern layer. The plurality of light emitting diode devices are disposed on the circuit layer and are electrically connected to the circuit layer respectively, where each of the plurality of light emitting diode devices includes a driving circuit.

In an embodiment of the twistable light emitting diode display module of the invention, each of the light emitting diode devices further includes a microcontroller (MCU).

In an embodiment, the twistable light emitting diode display module of the invention further includes a controller and a connecting device connecting the controller to the exposed part of the electrode pattern layer.

In an embodiment of the twistable light emitting diode display module of the invention, the connecting device includes a wire, a conductive fiber, a conductive fabric, low-temperature soldering tin, a conductive metal adhesive, a liquid metal package or a combination thereof.

The twistable light emitting diode display module of the invention includes a twistable substrate, a circuit layer, and a plurality of light emitting diode devices. The circuit layer is disposed on the twistable substrate. The plurality of light emitting diode devices are disposed on the circuit layer and are electrically connected to the circuit layer respectively, where each of the plurality of light emitting diode devices includes a transceiver used in a wireless communications network and a driving circuit.

In an embodiment, the twistable light emitting diode display module of the invention further includes a controller wirelessly connected to each transceiver.

In an embodiment of the twistable light emitting diode display module of the invention, the wireless communications network includes a Bluetooth communications network or a 5G communications network.

In an embodiment of the twistable light emitting diode display module of the invention, a projection area of each of the plurality of light emitting diode devices on the circuit layer is no more than 50 mm×50 mm.

In an embodiment, the twistable light emitting diode display module of the invention further includes a protective layer disposed on each of the plurality of light emitting diode devices and the circuit layer.

In an embodiment of the twistable light emitting diode display module of the invention, a conductive adhesive layer is disposed between each of the plurality of light emitting diode devices and the circuit layer.

In an embodiment of the twistable light emitting diode display module of the invention, the conductive adhesive layer includes an anisotropic conductive film (ACF), a conductive adhesive, low-temperature soldering tin, a liquid metal package or a combination thereof.

Based on the foregoing, in the twistable light emitting diode display module of the invention, because the opening in the insulating layer may expose a connection point connected to an external device, the electrode pattern layer disposed on the twistable substrate may be effectively protected by the insulating layer from being easily damaged. In addition, because the opening is located at the edge of the insulating layer and exposes the connection point located at the edge of the twistable substrate, the external device may be easily connected to the connection point. In addition, in the twistable light emitting diode display module of the invention, because the twistable light emitting diode device includes a driving circuit, only one circuit layer is needed for electrically connecting the plurality of light emitting diode devices to each other. Therefore, the thickness of the light emitting diode display module can be greatly reduced.

To make the features and advantages of the invention clear and easy to understand, the following gives a detailed description of embodiments with reference to accompanying drawings.

DESCRIPTION OF THE EMBODIMENTS

The following makes detailed description by listing embodiments and with reference to accompanying drawings, but the provided embodiments are not intended to limit the scope covered by the present invention. In addition, the drawings are drawn only for the purpose of description, and are not drawn according to original sizes. For ease of understanding, same elements in the following description are described by using same signs.

Terms such as "includes", "comprises", and "having" used herein are all inclusive terms, namely, mean "includes but not limited to".

In addition, the directional terms mentioned herein, like "above" and "below", refer to the directions in the appended drawings instead of limiting the invention. Therefore, it should be understood that, "above" and "below" may be used interchangeably, and when an element such as a layer or a film is disposed "above" another element, the element may be directly disposed on the another element, or an intermediate element may exist. On the other hand, when the element is "directly" disposed "above" the another element, there is no intermediate component between the two elements.

In the following embodiments, the mentioned quantity and shape are only intended to specifically describe the invention for ease of understanding the content of the invention instead of limiting the invention.

Figure 1A:
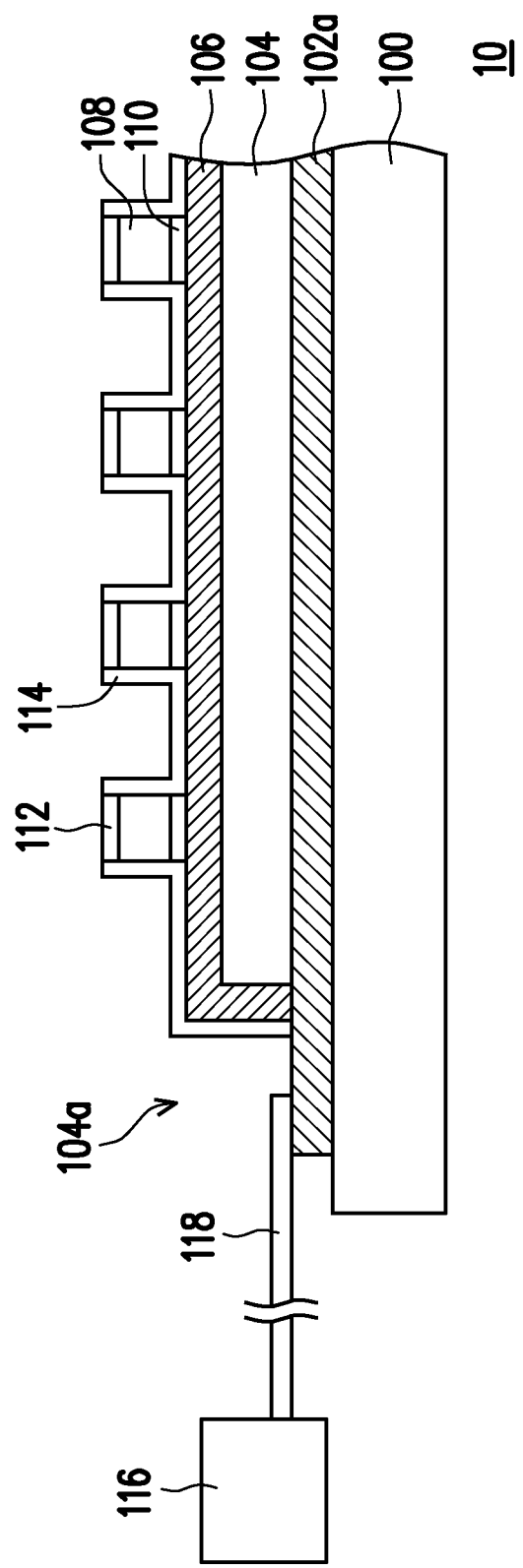
FIG. 1A is a schematic cross-sectional view of a twistable light emitting diode display module according to a first embodiment of the invention.
Figure 1B:
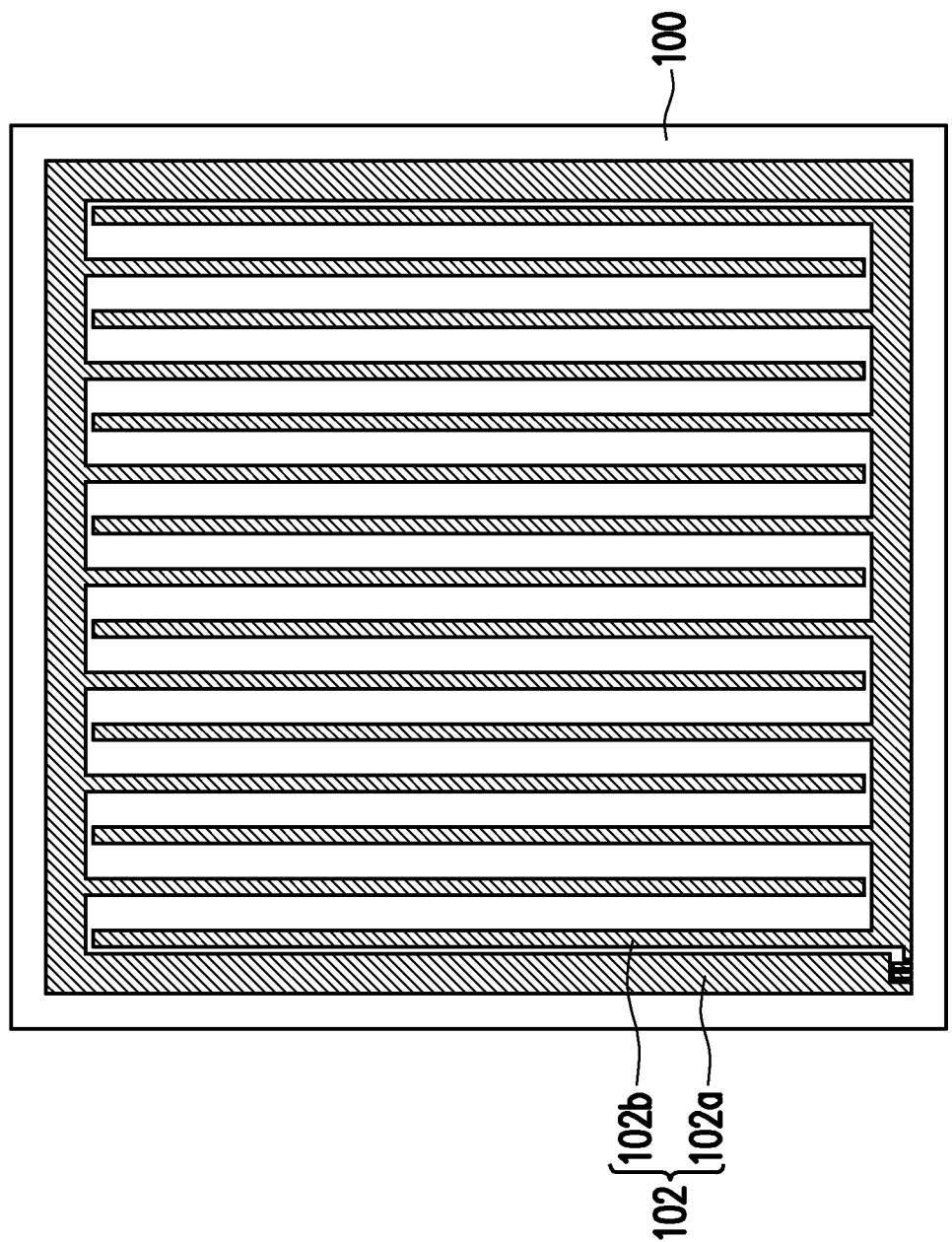
FIG. 1B is a schematic top view of an electrode pattern layer in the twistable light emitting diode display module according to the first embodiment of the invention.
Figure 1C:
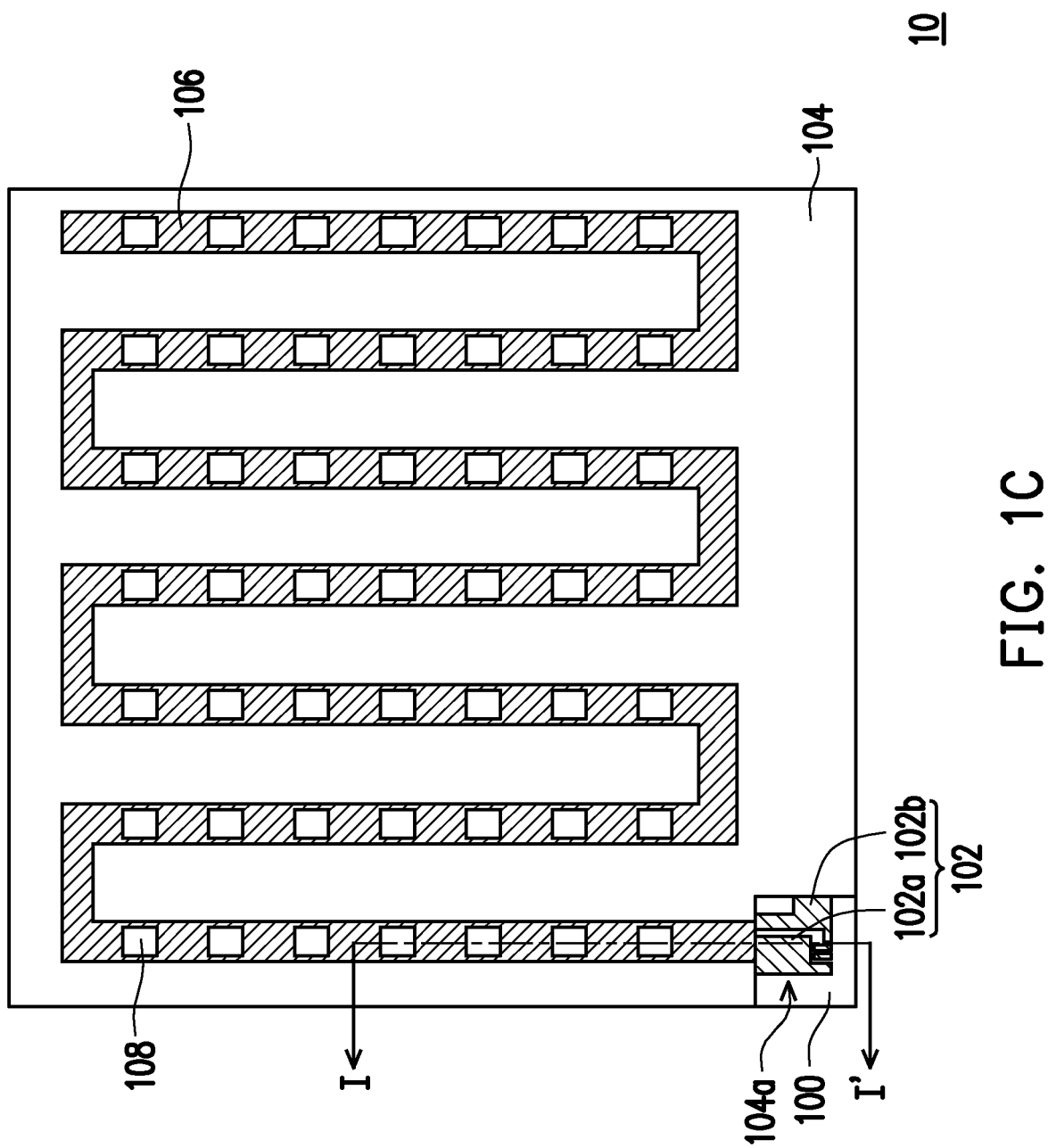
FIG. 1C is a schematic top view of the twistable light emitting diode display module according to the first embodiment of the invention.

FIG. 1A is a schematic cross-sectional view of a twistable light emitting diode display module according to a first embodiment of the invention. FIG. 1B is a schematic top view of an electrode pattern layer in the twistable light emitting diode display module according to the first embodiment of the invention. FIG. 1C is a schematic top view of the twistable light emitting diode display module according to the first embodiment of the invention. FIG. 1A is drawn along a line I-I' in FIG. 1C, and for clear representation, a protective layer, a controller, and a connecting device are omitted in FIG. 1C.

Referring to FIG. 1A, FIG. 1B, and FIG. 1C, the twistable light emitting diode display module 10 in the present embodiment includes a twistable substrate 100, an electrode pattern layer 102, an insulating layer 104, a circuit layer 106, and a plurality of light emitting diode devices 108. The twistable substrate 100 has features such as being flexible, twistable, and foldable. In the present embodiment, the twistable substrate 100 may be a polyurethane (PU) substrate, a silicon substrate, a rubber substrate or another suitable substrate.

The electrode pattern layer 102 is disposed on the twistable substrate 100. In the present embodiment, the electrode pattern layer 102 constitutes a finger electrode, which includes an electrode 102a and an electrode 102b, as shown in FIG. 1B. The electrode 102a and the electrode 102b may serve as a positive electrode and a negative electrode respectively. The electrode 102a and the electrode 102b respectively include a body portion and a finger portion extending from the body portion, and the finger portion of the electrode 102a and the finger portion of the electrode 102b are alternately arranged. However, the invention is not limited thereto. In other embodiments, the electrode pattern layer 102 may constitute various patterns according to actual requirements. The material of the electrode pattern layer 102 may be any suitable conductive material, and may be formed on the twistable substrate 100 through any suitable manner (such as spraying, screen printing, roll-to-roll printing, or 3D printing).

The insulating layer 104 is disposed on the electrode pattern layer 102. An edge of the insulating layer 104 is provided with an opening 104a. The opening 104a is located at an edge of the twistable substrate 100 and exposes a part of the electrode pattern layer 102. In the present embodiment, a corner (the bottom left corner in FIG. 1C) of the insulating layer 104 is provided with the opening 104a, and the opening 104a is located at the corner (the bottom left corner in FIG. 1C) of the twistable substrate 100 and exposes a part of the electrode 102a and a part of the electrode 102b. The exposed part of the electrode 102a and the exposed part of the electrode 102b may serve as a connection point connected to an external device. In other embodiments, the opening 104a may alternatively not be located at the corner provided that the required connection point position is exposed and easily to be connected. The material of the insulating layer 104 may be any suitable insulating material, and may be formed on the twistable substrate 100 through any suitable manner (such as spraying, screen printing, roll-to-roll printing, or 3D printing), to cover the electrode pattern layer 102.

The circuit layer 106 is disposed on the insulating layer 104. In addition, the circuit layer 106 is disposed on sidewalls of the opening 104a, and extends along the sidewalls of the opening 104a to the bottom of the opening 104a to connect to the electrode pattern layer 102. In this way, when the connection point exposed by the opening 104a is connected to the external device, the external device may provide a voltage to start an electronic element that is electrically connected to the circuit layer 106. In addition, the circuit layer 106 may be used for electrically connecting a plurality of electronic elements that are electrically connected to the circuit layer 106 to each other. The layout of the circuit layer 106 is not limited to that shown in FIG. 1C, and in other embodiments, the layout of the circuit layer 106 may be adjusted according to actual requirements. The material of the circuit layer 106 may be any suitable conductive material, and may be formed on the insulating layer 104 through any suitable manner (such as spraying, screen printing, roll-to-roll printing, or 3D printing).

The light emitting diode devices 108 are disposed on the circuit layer 106, and are electrically connected to the circuit layer 106 respectively. In addition, each light emitting diode device 108 includes a driving circuit (not shown). In this way, when the external device provides the voltage, the light emitting diode device 108 may be started by the voltage to emit light. In addition, the light emitting diode device 108 may additionally include a microcontroller (MCU), so that the external device (not shown) may further control the light emitting diode device 108.

In the present embodiment, the light emitting diode device 108 may be fixed on the circuit layer 106 by a conductive adhesive layer 110 and is electrically connected to the circuit layer 106. The conductive adhesive layer 110 may be an anisotropic conductive film (ACF), a conductive adhesive (such as a silver adhesive or a tin adhesive), low-temperature soldering tin, a liquid metal package or a combination thereof. In addition, the arrangement of the light emitting diode devices 108 is not limited in the invention. Therefore, the light emitting diode devices 108 emitting light of different colors may be arranged according to actual requirements.

In the present embodiment, a projection area of the light emitting diode device 108 on the circuit layer 106 is no more than 50 mm×50 mm. Preferably, a projection area of the light emitting diode device 108 on the circuit layer may be 20 mm×20 mm, or even smaller. That is, in the present embodiment, the circuit layer 106 may have a subtle width because a small-sized light emitting diode device 108 is used, and further the size of the light emitting diode display module 10 can be reduced. In addition, the light emitting diode device 108 is a light emitting diode device including the driving circuit. Therefore, the circuit layer 106 only needs a function of electrically connecting the plurality of light emitting diode devices 108 to each other instead of a function like a driving circuit. In this way, the foregoing objective can be achieved only by using one circuit layer 106. Therefore, the thickness of the light emitting diode display module 10 can be greatly reduced.

In the present embodiment, the light emitting diode display module 10 may further include a protective layer 112 disposed on a top surface of the light emitting diode device 108. The material of the protective layer 112 is a light-transparent material that has features such as water resistance, heat conduction, and moisture impermeability, and may be formed on the top surface of the light emitting diode device 108 through any suitable manner (such as dispensing, spraying, screen printing, roll-to-roll printing, or 3D printing). In addition, a colored light-transparent material may be used to form the protective layer 112, so as to adjust the colors of light emitted by the light emitting diode device 108.

In addition, in the present embodiment, the light emitting diode display module 10 may further include a protective layer 114 disposed on the circuit layer 106. The material and the forming method of the protective layer 114 may be the same as those of the protective layer 112. The protective layer 114 may further be disposed on sidewalls of the light emitting diode device 108. In addition, the colored light-transparent material or a light-proof material may be used to form the protective layer 114. In this way, various colors in appearance may be shown by the light emitting diode display module 10, and may be further matched with the light emitted by the light emitting diode device 108, so as to further show various patterns, colors, and the like in appearance.

Furthermore, in the present embodiment, the light emitting diode display module 10 may further include a controller 116 and a connecting device 118 connecting the controller 116 to the exposed part (namely, the connection point) of the electrode pattern layer 102. The controller 116 may include various electronic elements (such as a battery, a wireless receiver, a wireless fidelity (WIFI) receiver, a Bluetooth receiver, an infrared receiver, and a display panel) according to actual requirements. This is not limited in the invention. Based on the foregoing, the controller 116 may provide a voltage to control the light emitting diode device 108. The connecting device 118 may be any form of connecting devices provided that the controller 116 is electrically connected to the exposed part of the electrode pattern layer 102. For example, the connecting device 118 may be a wire (such as a copper wire and a gold wire), a conductive fiber, a conductive fabric, low-temperature soldering tin, a conductive metal adhesive, a liquid metal package or a combination thereof.

In the present embodiment, the insulating layer 104 only needs to be provided with one opening 104a to expose the connection point connected to the external device. Therefore, the electrode pattern layer 102 disposed on the twistable substrate 100 may be effectively protected by the insulating layer 104 from being easily damaged. In addition, because the opening 104a is located at the edge of the insulating layer 104 and exposes the connection point located at the edge of the twistable substrate 100, the external device may be easily connected to the connection point. In addition, in the present embodiment, the edge of the insulating layer 104 may be provided with other openings to expose a connection point used for connecting to another light emitting diode display module. In this way, a large scale application can be achieved by electrically connecting a plurality of light emitting diode display modules.

In the present embodiment, the light emitting diode device 108 is a light emitting diode device including the driving circuit. In other embodiments, the used light emitting diode device may alternatively be a light emitting diode device that includes both a transceiver used in a wireless communications network and a driving circuit. That is, the used light emitting diode device may be controlled in a wireless manner. In this way, only one circuit layer in the light emitting diode display module may alternatively be used for electrically connecting the plurality of light emitting diode devices to each other and the circuit layer does not need to have the function like the driving circuit.

Figure 2:
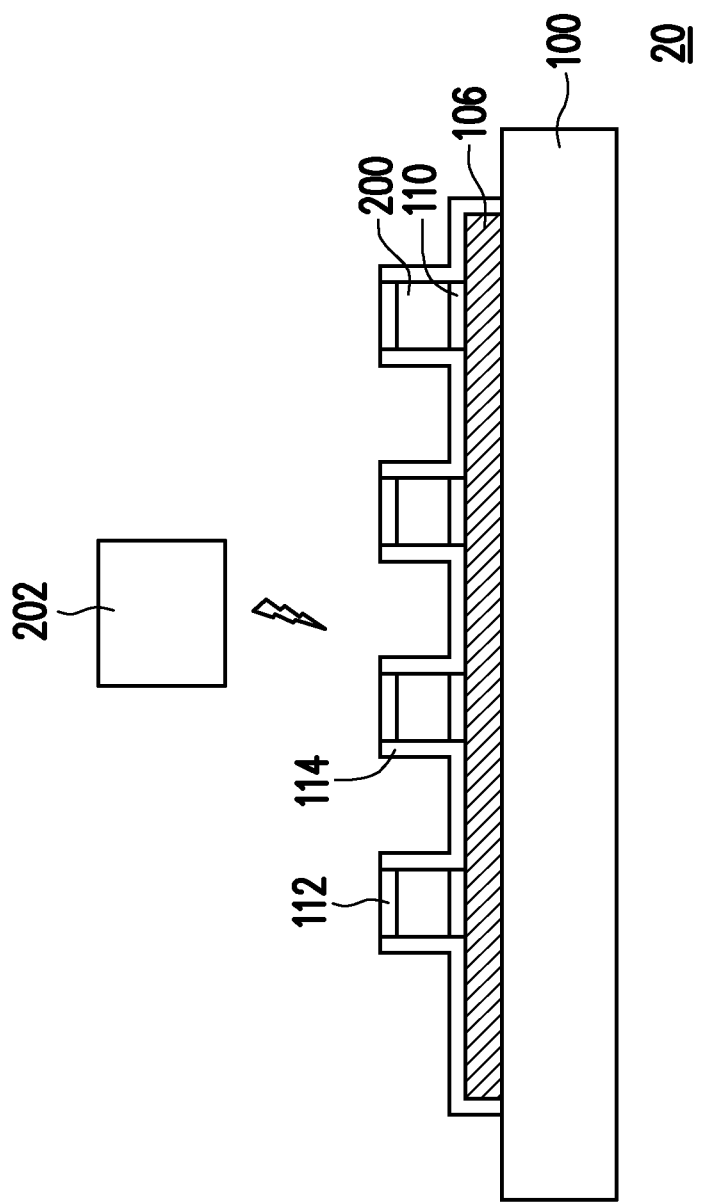
FIG. 2 is a schematic cross-sectional view of a twistable light emitting diode display module according to a second embodiment of the invention.

FIG. 2 is a schematic cross-sectional view of a twistable light emitting diode display module according to a second embodiment of the invention. In the present embodiment, elements same as those in the first embodiment are represented by using the same element symbols, and are not described again.

Referring to FIG. 2, the twistable light emitting diode display module 20 in the present embodiment includes a twistable substrate 100, a circuit layer 106, and a plurality of light emitting diode devices 200. The light emitting diode device 200 are disposed on the circuit layer 106, and are electrically connected to each other by using the circuit layer 106. The light emitting diode device 200 includes a transceiver (not shown) used in a wireless communications network and a driving circuit (not shown). The wireless communications network may be a Bluetooth communications network or a 5G communications network. In other words, in the present embodiment, because the light emitting diode device 200 may be controlled by means of wireless communications, the circuit layer 106 used for electrically connecting the plurality of light emitting diode devices to each other may be directly disposed on the twistable substrate 100 without additionally disposing an electrode layer. In this way, the thickness of the light emitting diode display module 20 can be greatly reduced, and the light emitting diode display module 20 may have a relatively simple structure.

In the present embodiment, the light emitting diode display module 20 may further include a controller 202. The controller 202 is wirelessly connected to the transceiver of each light emitting diode device 200. Therefore, each light emitting diode device 200 may be wirelessly controlled. In addition, the controller 200 may include various electronic elements (such as a battery, a receiver, and a display panel) according to actual requirements. This is not limited in the invention.

In addition, similar to the first embodiment, the light emitting diode display module 20 may further include a protective layer 112 disposed on a top surface of the light emitting diode device 108, and may alternatively include a protective layer 114 disposed on the circuit layer 106 and/or sidewalls of the light emitting diode device 108.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A twistable light emitting diode display module, comprising:
   a twistable substrate;
   an electrode pattern layer, disposed on the twistable substrate;
   an insulating layer, disposed on the electrode pattern layer, wherein an edge of the insulating layer has an opening, and the opening is located at an edge of the twistable substrate and exposes a part of the electrode pattern layer;
   a circuit layer, disposed on the insulating layer and on sidewalls of the opening, and connected to the electrode pattern layer; and
   a plurality of light emitting diode devices, disposed on the circuit layer and electrically connected to the circuit layer respectively, wherein each of the plurality of light emitting diode devices comprises a driving circuit.

2. The twistable light emitting diode display module according to claim 1, wherein a projection area of each of the plurality of light emitting diode devices on the circuit layer is no more than 50 mm×50 mm.

3. The twistable light emitting diode display module according to claim 1, wherein each of the light emitting diode devices further comprises a microcontroller.

4. The twistable light emitting diode display module according to claim 1, further comprising:
   a controller; and
   a connecting device, connecting the controller to an exposed part of the electrode pattern layer.

5. The twistable light emitting diode display module according to claim 4, wherein the connecting device comprises a wire, a conductive fiber, a conductive fabric, low-temperature soldering tin, a conductive metal adhesive, a liquid metal package, or a combination thereof.

6. The twistable light emitting diode display module according to claim 1, further comprising a protective layer, disposed on each of the plurality of light emitting diode devices and the circuit layer.

7. The twistable light emitting diode display module according to claim 1, wherein a conductive adhesive layer is disposed between each of the plurality of light emitting diode devices and the circuit layer.

8. The twistable light emitting diode display module according to claim 7, wherein the conductive adhesive layer comprises an anisotropic conductive film, a conductive adhesive, low-temperature soldering tin, a liquid metal package, or a combination thereof.

9. A twistable light emitting diode display module, comprising:
   a twistable substrate;
   a circuit layer, disposed on the twistable substrate; and
   a plurality of light emitting diode devices, disposed on the circuit layer and electrically connected to the circuit layer respectively, wherein each of the plurality of light emitting diode devices has a transceiver used in a wireless communications network and a driving circuit.

10. The twistable light emitting diode display module according to claim 9, wherein a projection area of each of the plurality of light emitting diode devices on the circuit layer is no more than 50 mm×50 mm.

11. The twistable light emitting diode display module according to claim 9, further comprising a controller, wirelessly connected to each transceiver.

12. The twistable light emitting diode display module according to claim 9, further comprising a protective layer, disposed on each of the plurality of light emitting diode devices and the circuit layer.

13. The twistable light emitting diode display module according to claim 9, wherein a conductive adhesive layer is disposed between each of the plurality of light emitting diode devices and the circuit layer.

14. The twistable light emitting diode display module according to claim 13, wherein the conductive adhesive layer comprises an anisotropic conductive film, a conductive adhesive, low-temperature soldering tin, a liquid metal package, or a combination thereof.

15. The twistable light emitting diode display module according to claim 13, wherein the wireless communications network comprises a Bluetooth communications network or a 5G communications network.

\* \* \* \* \*